(12) United States Patent
Sun

(10) Patent No.: US 8,628,337 B2
(45) Date of Patent: Jan. 14, 2014

(54) ATTACHMENT MECHANISM FOR ELECTRONIC COMPONENT

(75) Inventor: Zheng-Heng Sun, New Taipei (TW)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 0 days.

(21) Appl. No.: 13/444,874

(22) Filed: Apr. 12, 2012

(65) Prior Publication Data

US 2013/0164950 A1 Jun. 27, 2013

(51) Int. Cl.
*H01R 12/00* (2006.01)

(52) U.S. Cl.
USPC .......................................... 439/74

(58) Field of Classification Search
USPC ............ 439/65, 67, 493, 494–496, 498–499, 439/326, 55, 74
See application file for complete search history.

(56) References Cited

U.S. PATENT DOCUMENTS

| 3,403,237 | A | * | 9/1968 | Wysong | 200/437 |
| 5,088,929 | A | * | 2/1992 | Enomoto | 439/66 |
| 5,378,169 | A | * | 1/1995 | Volz et al. | 439/376 |
| 5,422,790 | A | * | 6/1995 | Chen | 361/719 |
| 7,134,869 | B2 | * | 11/2006 | Lichtinger | 425/576 |
| 7,294,009 | B1 | * | 11/2007 | Peng et al. | 439/326 |
| 8,130,489 | B2 | * | 3/2012 | Chan et al. | 361/679.32 |
| 8,500,461 | B2 | * | 8/2013 | Tseng et al. | 439/74 |

FOREIGN PATENT DOCUMENTS

TW  M368209 U1  11/2009

* cited by examiner

*Primary Examiner* — Neil Abrams
*Assistant Examiner* — Phuongchi T Nguyen
(74) *Attorney, Agent, or Firm* — Altis Law Group, Inc.

(57) ABSTRACT

An attachment mechanism for an electronic component includes a circuit board and a fastener. The circuit board includes a first connector connected to a second connector of the electronic component. The fastener includes two operation portions and a connection portion connected between the operation portions. The operation portions clamp the first connector. A hook extends from a top of the connection portion to engage with a first end of the electronic component.

8 Claims, 4 Drawing Sheets

ATTACHMENT MECHANISM FOR ELECTRONIC COMPONENT

CROSS-REFERENCE TO RELATED APPLICATIONS

Relevant subject matter is disclosed in three pending U.S. patent applications, all titled "ATTACHMENT MECHANISM FOR ELECTRONIC COMPONENT", respectively filed on Mar. 20, Mar. 22, 2012, and Mar. 23, 2012, with the application Ser. Nos. 13/424,390, 13/426,629, and 13/427,923, which are assigned to the same assignee as this patent application.

BACKGROUND

1. Technical Field

The present disclosure relates to a mechanism for attaching an electronic component to a device.

2. Description of Related Art

Certain components in a server, such as expansion cards, need to be attached to the motherboard of the server. Taking such an expansion card for example, an end of the expansion card is fastened to the motherboard, and a connector at an opposite end of the expansion card is connected to a connector of the motherboard. However, the connection of the connectors may not be solid enough and the expansion card may disengage from the connector of the motherboard, which adversely influences the data transmission of the server.

BRIEF DESCRIPTION OF THE DRAWINGS

Many aspects of the present embodiments can be better understood with reference to the drawings. The components in the drawings are not necessarily drawn to scale, the emphasis instead being placed upon clearly illustrating the principles of the present embodiments. Moreover, in the drawings, all the views are schematic, and like reference numerals designate corresponding parts throughout the several views.

DETAILED DESCRIPTION

The disclosure, including the accompanying drawings, is illustrated by way of example and not by way of limitation. It should be noted that references to "an" or "one" embodiment in this disclosure are not necessarily to the same embodiment, and such references mean at least one.

Figure 1:
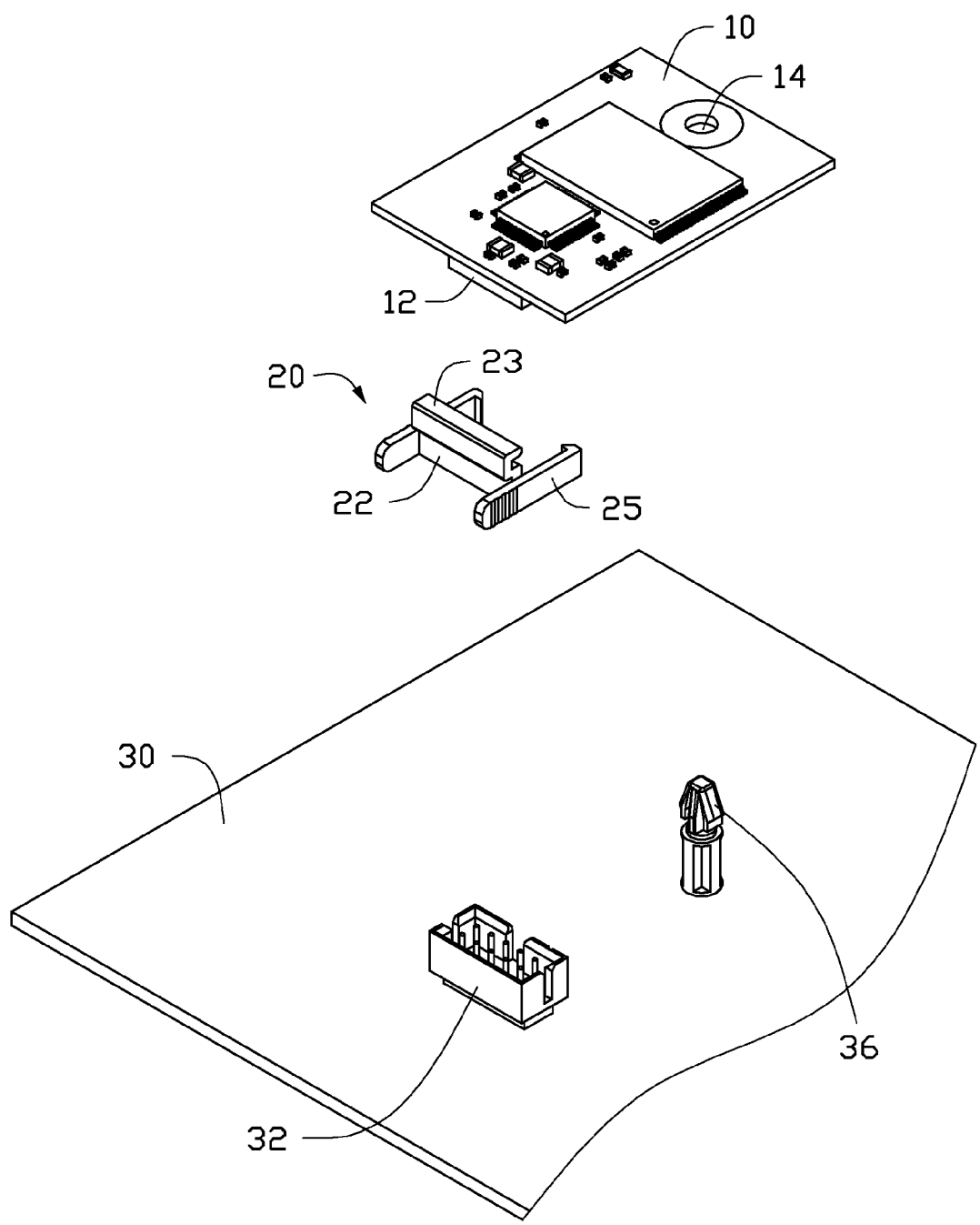
FIG. 1 is an exploded, isometric view of an exemplary embodiment of an attachment mechanism, together with an electronic component, wherein the attachment mechanism includes a fastener.

FIG. 1 shows an exemplary embodiment of an attachment mechanism for fastening an electronic component 10. The attachment mechanism includes a circuit board 30 and a fastener 20. The electronic component 10 includes a first connector 12 mounted to a first end of a side surface of the electronic component 10, and defines a through hole 14 in a second end of the electronic component 10 opposite to the first end.

A second connector 32 is fastened to the circuit board 30. A hook 36 extends up from the circuit board 30.

Figure 2:
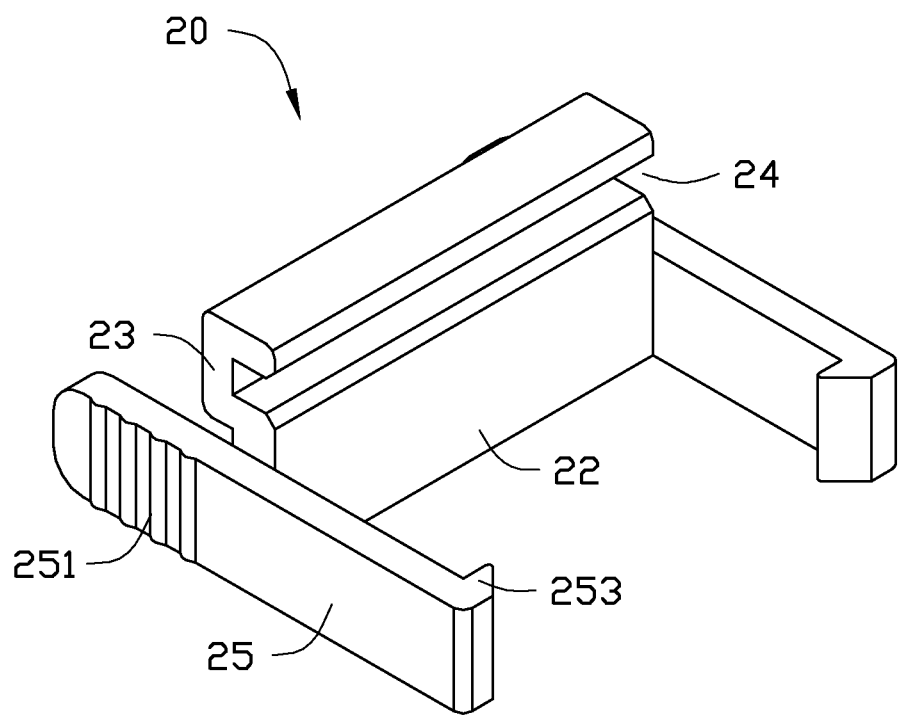
FIG. 2 is an enlarged view of the fastener of FIG. 1, but viewed from a different perspective.

FIG. 2 shows the fastener 20 including two parallel operation portions 25 and a substantially L-shaped connection portion 22 perpendicularly connected between middles of the operation portions 25. A top of the connection portion 22 extends forward. An L-shaped holding portion 23 extends from a front side of the top of the connection portion 22. The holding portion 23 extends up from the connection portion 22 and then extends backward. The holding portion 23 and the top of the connection portion 22 together bound a receiving slot 24. A wedge-shaped latch 253 extends from a rear end of each operation portion 25 toward the other operation portion 25. A plurality of strips 251 protrudes from a front portion of an outer side surface of each operation portion 25, for conveniently manipulating the operation portion 25.

Figure 3:
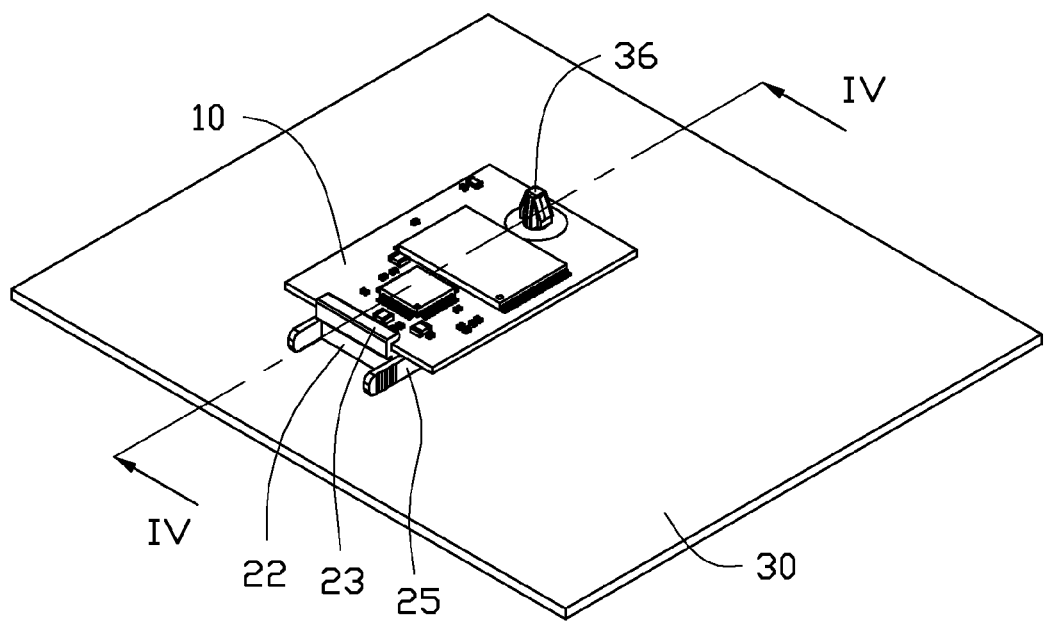
FIG. 3 is an assembled, isometric view of FIG. 1.
Figure 4:
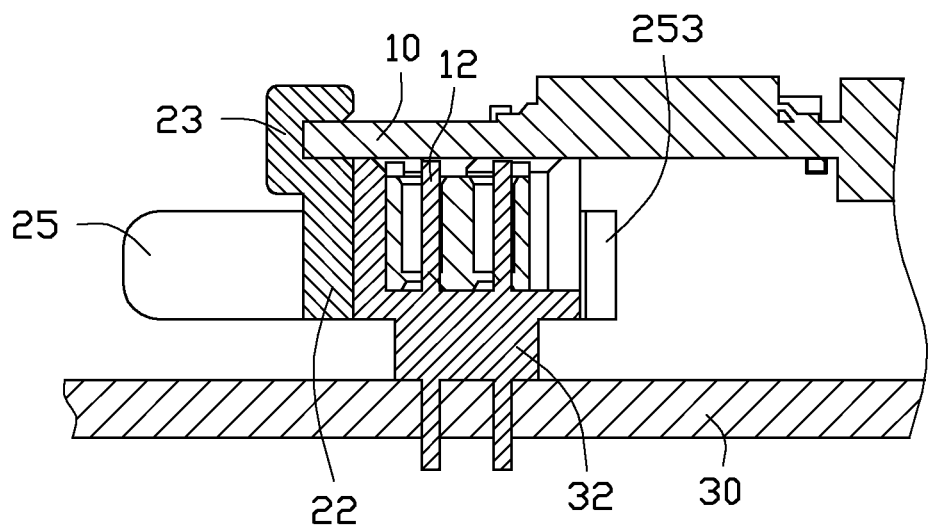
FIG. 4 is a sectional view taken along the line of IV-IV of FIG. 3.

FIGS. 3 and 4 show in assembly, the first connector 12 is connected to the second connector 32. The hook 36 extends through the through hole 14, to fasten the second end of the electronic component 10. The fastener 20 is placed in front of the second connector 32, opposite to the hook 36. The fastener 20 is moved toward the second connector 32. The operation portions 25 resiliently clamp the second connector 32, and the latches 253 with the corresponding operation portions 25 are deformed away from each other. When the connection portion 22 abuts against a front side of the second connector 32, the operation portions 25 are restored to allow the latches 253 to abut against a rear side of the second connector 32. The first end of the electronic component 10 is received in the receiving slot 24. Inner side surfaces of the operation portions 25 abut against the corresponding end surfaces of the second connector 32. Thereby, the electronic component 10 is fastened to the circuit board 30.

To detach the electronic component 10, front portions of the operation portions 25 are manipulated toward each other, so that the latches 253 together with back portions of the operation portions 25 are away from each other. The fastener 20 is moved away from the electronic component 10 and the second connector 32. The electronic component 10 disengages from the second connector 32. The second end of the electronic component 10 disengages from the hook 36. Thereby, the electronic component 10 is disassembled from the circuit board 30.

It is believed that the present embodiments and their advantages will be understood from the foregoing description, and various changes may be made thereto without departing from the spirit and scope of the description or sacrificing all of their materials advantages, the examples hereinbefore described merely being exemplary embodiments.

What is claimed is:

1. An attachment mechanism for fastening an electronic component having a first connector, the attachment mechanism comprising:
   a circuit board comprising a second connector to be connected to the first connector of the electronic component; and
   a fastener comprising two operation portions and a connection portion connected between the operation portions, the operation portions clamping the second connector, a holding portion extending from a top of the connection portion to engage with a first end of the electronic component;
   wherein the connection portion abuts against a first side of the second connector, the operation portions respectively abut against opposite ends of the second connector, two latches respectively extend from the operation portions to abut against a second side of the second connector opposite to the first side.

2. The attachment mechanism of claim 1, wherein a plurality of strips protrudes from an outer side of each operation portions.

3. The attachment mechanism of claim 1, wherein a hook extends up from the circuit board, to fasten a second end of the electronic component.

4. The attachment mechanism of claim 1, wherein the holding portion defines a receiving slot to receive the first end of the electronic component.

5. A circuit board assembly, comprising:
- an electronic component comprising a first connector;
- a circuit board comprising a second connector connected to the first connector; and
- a fastener comprising two operation portions and a connection portion connected between the operation portions, the operation portions clamping the second connector, a holding portion extending from a top of the connection portion to engage with a first end of the electronic component;
- wherein the connection portion abuts against a first side of the second connector, the operation portions respectively abut against opposite ends of the second connector, two latches respectively extend from the operation portions to abut against a second side of the second connector opposite to the first side.

6. The circuit board assembly of claim 5, wherein a plurality of strips protrudes from an outer side of each operation portions opposite to the second connector.

7. The circuit board assembly of claim 5, wherein a hook extends up from the circuit board, to fasten a second end of the electronic component.

8. The circuit board assembly of claim 5, wherein the holding portion defines a receiving slot to receive the first end of the electronic component.

* * * * *